(12) United States Patent
Smith

(10) Patent No.: US 7,155,647 B2
(45) Date of Patent: Dec. 26, 2006

(54) SCAN OF CHIP STATE FROM A HIERARCHICAL DESIGN

(75) Inventor: Brian L. Smith, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 343 days.

(21) Appl. No.: 10/430,726

(22) Filed: May 6, 2003

(65) Prior Publication Data

US 2004/0225938 A1 Nov. 11, 2004

(51) Int. Cl.
*G01R 31/28* (2006.01)

(52) U.S. Cl. ................ 714/726; 714/727; 714/729

(58) Field of Classification Search ............. 714/724, 714/726, 727, 729; 395/183.06
See application file for complete search history.

(56) References Cited

U.S. PATENT DOCUMENTS

| 5,717,702 A * | 2/1998 | Stokes et al. ............. 714/730 |
| 6,028,983 A * | 2/2000 | Jaber ........................ 714/30 |
| 6,530,052 B1 * | 3/2003 | Khou et al. ................ 714/733 |
| 6,779,143 B1 * | 8/2004 | Grisenthwaite ............ 714/727 |

\* cited by examiner

*Primary Examiner*—Albert Decady
*Assistant Examiner*—John J. Tabone, Jr.
(74) *Attorney, Agent, or Firm*—Meyertons Hood Kivlin Kowert & Goetzel, P.C.; Rory D. Rankin

(57) ABSTRACT

A method and mechanism for observation, testing, and diagnosis with scan chains. A device under test is configured to support scan chains. The device includes multiple blocks, each of which are configured to be individually tested with separate scan chains. Each block is configured to recirculate the scan output of its block back into its scan chain during the cycles in which it is not being directly scanned out of the chip. As the scan clock is pulsed N cycles and another block of the chip is scanned out, the recirculated state of the block will shift within the block N positions. By keeping track of the scan chain lengths of each of the blocks in the chip, and the order in which they are scanned, a determination may be made as to which element of the scan chain will be shifted out of the next block to be scanned. Further, by knowing the length N of the scan chain of a particular block and the number of cycles M it has been recirculated, the scan chain may be shifted (M % N) cycles to return the block to its originally ordered state before scanning it out.

12 Claims, 6 Drawing Sheets

SCAN OF CHIP STATE FROM A HIERARCHICAL DESIGN

BACKGROUND OF THE INVENTION

1. Field of the Invention

This invention relates to the testing of electronic circuits and, more specifically, to the use of scan based testing.

2. Description of the Relevant Art As the gate and pin counts of integrated circuits has grown, device-level testing of integrated circuits has become increasingly difficult. Subsequent to manufacture, access to the internal circuitry of a device (or "chip") may be limited. In many cases, access to a chip's circuitry is only available at its boundary through its external pins. Scan based techniques are one technique utilized to test integrated circuits with large gate and pin counts.

Scan techniques include boundary scan testing and internal scan testing. Boundary scan testing generally occurs at the boundary between the core logic of a device and its external pin connections. A device configured for boundary scan typically includes boundary scan cells, each of which is located between a signal pin and the core logic of the device. A plurality of these boundary scan cells may be connected together to form a boundary scan chain, or path. On the other hand, internal scan testing generally involves partitioning a chips logic into individually testable units. FIG. 1 is an illustration of an exemplary integrated circuit (IC) 100 configured for boundary scan testing. The IC 100 includes a plurality of boundary scan cells chained together. During normal IC 100 operations, data may pass unaffected through the boundary scan cells between the core logic and signal pins. During boundary scan test operations, test data may enter the IC 100 through the TDI (Test Data In) pin 110, and pass through the chain of boundary scan cells, leaving the chip through the TDO (Test Data Out) pin 120. The path 130 the test data traverses is also illustrated. In effect, the chain of boundary scan cells acts as a shift register, as data bits may be shifted from one cell to the next.

The state of each boundary scan cell may be monitored during scan shifting through those signal pins associated with an output or bi-directional signal. For example, during boundary scan testing of the exemplary IC 100 shown in FIG. 1 (assuming all pins are bi-directional), the state of each boundary scan cell may be monitored by automated test equipment (ATE) through its associated signal pin as data bits are shifted through the boundary scan path 130. During the shifting of data through the boundary scan path 130, each cell will typically make several transitions between a logic high level and a logic low level. If a defect is present (such as an unsoldered signal pin), the ATE may not detect the expected state for the given cell at a given time, thereby causing a test failure. In this manner, a defective signal connection may be detected. For input signals, test data may be driven into a boundary scan cell through its associated signal pin, and may be monitored through the TDO pin 120 after shifting it through the scan chain.

As already noted, often times scan testing is configured wherein the scan chains of a number of blocks in a device are coupled together. To this end, longer, scan paths may be created by coupling the TDO output of one scan block to the TDI input of another. FIG. 2 is a block diagram of a single scan path. In the drawing, a plurality of scan blocks 210A–210C are chained together by coupling TDO outputs to TDI inputs. A TMS (Test Mode Select) signal is used to place the chips in a test mode, while the TCK (Test Clock) provides the necessary clock signal for shifting data through the scan chain. Elements referred to herein with a particular reference number followed by a letter will be collectively referred to by the reference number alone. For example, scan blocks 210A–210C will be collectively referred to as scan blocks 210.

In a chip composed of hierarchical blocks with separate scan chains, it can be very difficult to coordinate the scan out of the full state of the chip when the blocks share a common scan clock. FIG. 2 illustrates one embodiment of a device 200 configured for internal scan testing. FIG. 2 shows five partitions 210A–210E which are each configured for scan testing. A control unit 290 is configured to control the scan chains for each of the partitions 210. In the embodiment shown, the control unit 290 is configured to convey a common scan clock signal 230 to all partitions 210. Also shown is a test mode signal 240 which may be used to indicate the mode of operation for each partition, normal or test. As seen in FIG. 2, each partition is coupled to the control unit 290 via two buses, 220 and 221. A first bus 220 is configured to convey test data to each partition, while the second bus 221 is configured to convey scan test data back to the control unit 290.

Generally speaking, each partition 210 includes a number of scan cells configured as a chain. Application of the scan clock 230 causes the data within the chain to shift by one scan cell. Because a common scan clock 230 is used by each of the partitions, coordinating the scan out of test data can be extremely difficult. While the internal state for one partition is being scanned out, the data within other partitions is also being clocked resulting in a loss of their state. Consequently, without gating the scan clock to each block, or creating separate scan clocks for each block, it is difficult to avoid this loss of state.

SUMMARY OF THE INVENTION

A method and mechanism for testing with scan chains are described herein.

In one embodiment, a device under test is composed of multiple blocks and is configured to support scan testing. In addition, each block of the device is configured to be individually tested. In one embodiment, each block includes circuitry at its scan chain input which allows the block to recirculate the scan output of its block back into its scan chain during the cycles in which it is not being directly scanned out of the chip. As the scan clock is pulsed N cycles and another block of the chip is scanned out, the recirculated state will shift within the block N positions.

In addition, by keeping track of the scan chain lengths of each of the blocks in the chip, and the order in which they are scanned, a determination may be made as to which element of the scan chain will be shifted out of the next block to be scanned. The full block state can be shifted out of the chip in the same number of cycles. It just starts at a different point in this virtual scan chain relative to the number of scan clocks the block has been shifted while scanning out the state of prior blocks.

In an alternative embodiment, by knowing the length N of the scan chain of a particular block and the number of cycles M it has been recirculated, the scan chain may be shifted (M % N) cycles to return the block to its original (appropriately ordered) state before scanning it out.

BRIEF DESCRIPTION OF THE DRAWINGS

Other objects and advantages of the invention will become apparent upon reading the following detailed description and upon reference to the accompanying drawings in which.

Figure 1:
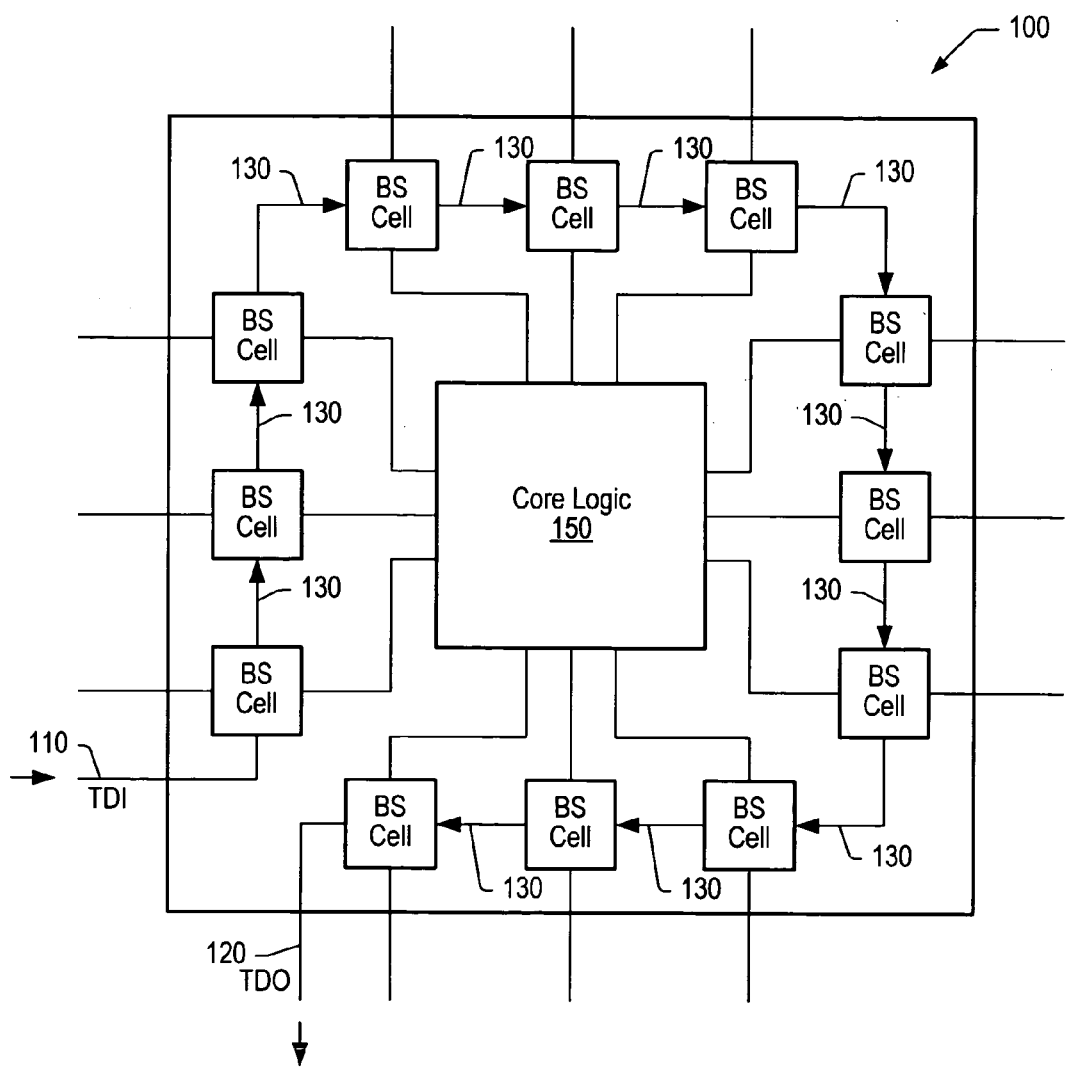
FIG. 1 is a block diagram of an exemplary integrated circuit configured for boundary scan testing.
Figure 2:
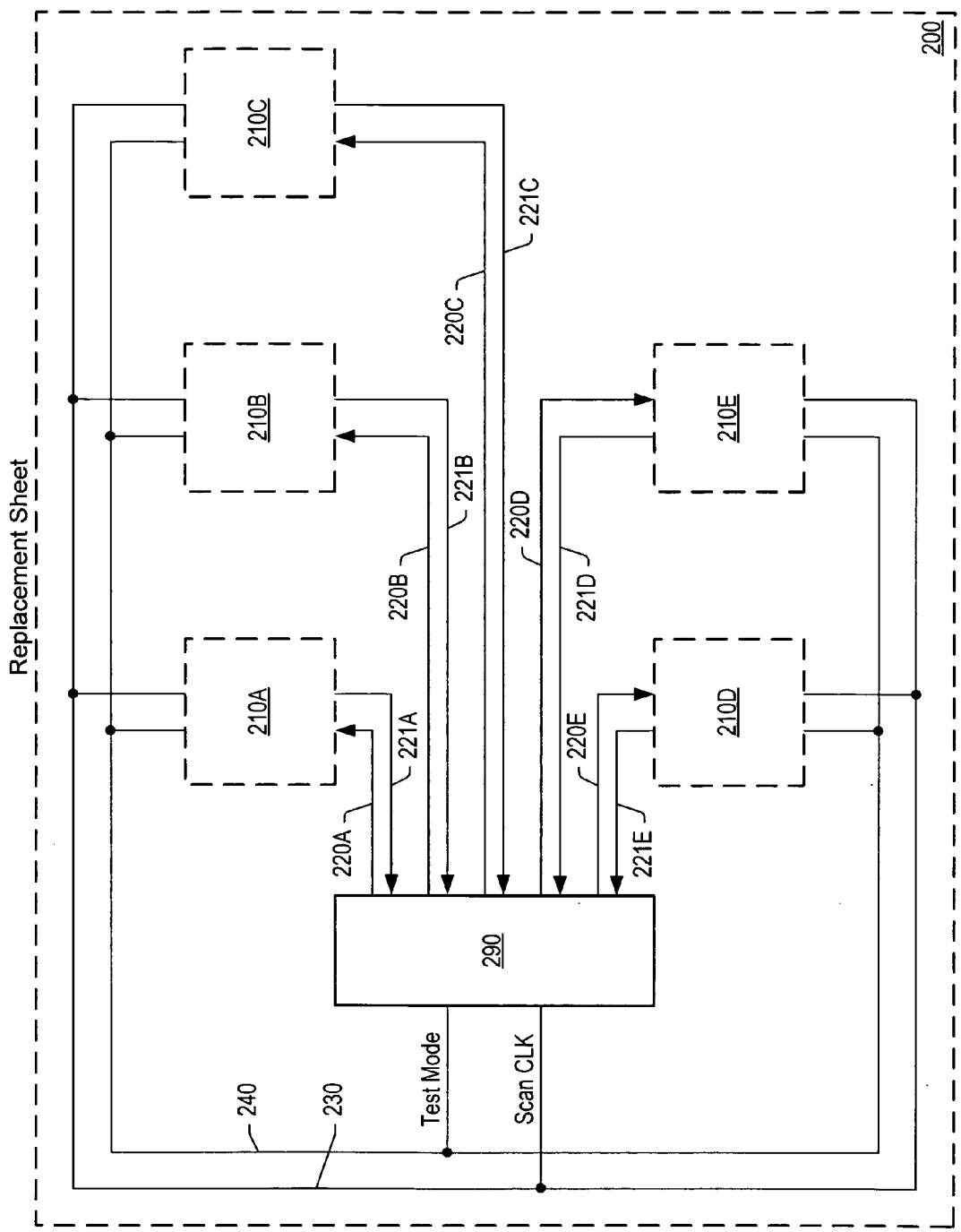
FIG. 2 is a block diagram illustrating a device configured for internal scan testing.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scoped of the present invention as defined be the appended claims.

DETAILED DESCRIPTION OF THE INVENTION

Figure 3A:
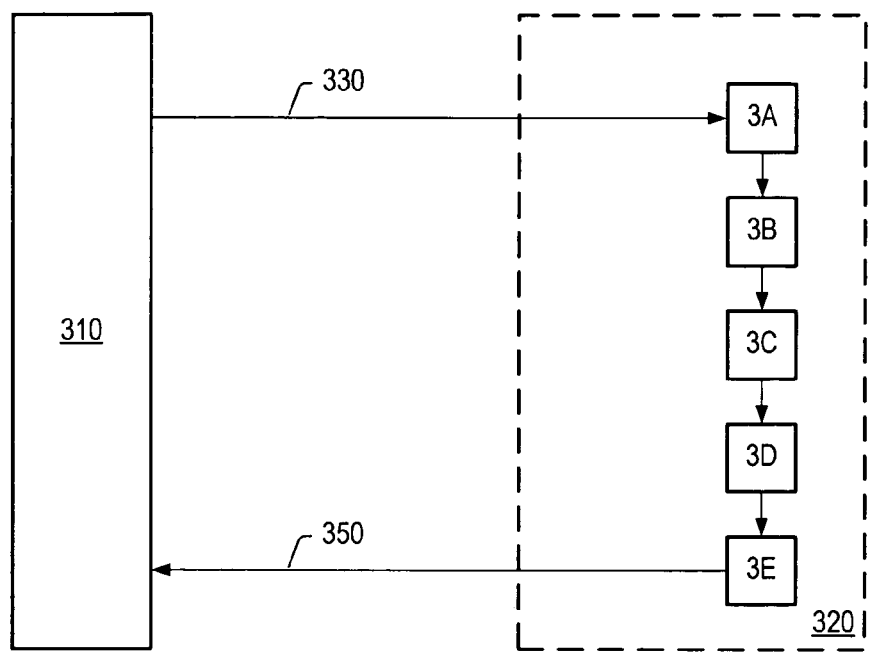
FIGS. 3A and 3B illustrate a scan chain modified to support recirculation.
Figure 3B:
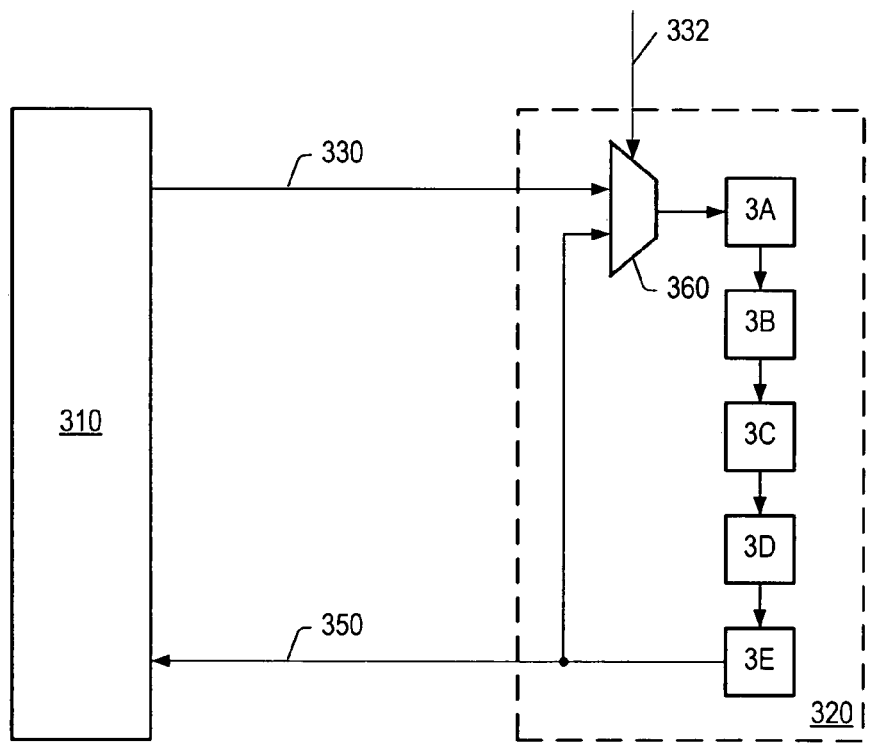

FIGS. 3A and 3B illustrate an overview of a scan chain which has been modified to support recirculation is illustrated. FIG. 3A shows a control circuit 310 coupled to a logic block 320. Block 320 includes a scan chain with five scan cells, 3A–3E. Control circuit 310 is configured to convey scan in data via signal 330 to a first scan cell 3A. Scan cell 3A is configured to shift its scan state to cell 3B, cell shifts its state to cell 3C, cell 3C shifts its state to cell 3D, cell 3D shifts its state to cell 3E, and finally cell 3E shifts its state to control circuit via signal 350. Scan cells 3A–3E may be viewed as a shift register which shifts in response to a scan clock signal (not shown). As may be seen from FIG. 3A, performing five shifts on scan cells 3A–3E will results in all cell states being conveyed out of block 320 and into control circuit 310.

FIG. 3B illustrates a modification which enables the scan states of block 320 to be recirculated in response to the scan clock, rather than shifted out of block 320 to circuit 310. In the example shown in FIG. 3B, a multiplexor 360 has been added to the scan chain of block 320. In addition, a "recirculate" control signal 332 coupled to multiplexor 360 has been added. Rather than scan in data signal 330 being directly coupled to scan cell 3A, signal 330 is coupled to multiplexor 360. Multiplexor 360 is also coupled to receive as input the signal 350 from scan cell 3E. Output from the multiplexor 360 is then coupled to scan cell 3A. Control signal 332 may then be used to select signal 350 to be conveyed from multiplexor 360. In this manner, scan cells 3A–3E may be configured to recirculate their respective scan states in response to the scan clock. Accordingly, even though the scan clock may be operational and causing scan states to shift, the scan cell states 3A–3E may be preserved for as long as desired by recirculating the states.

Figure 4:
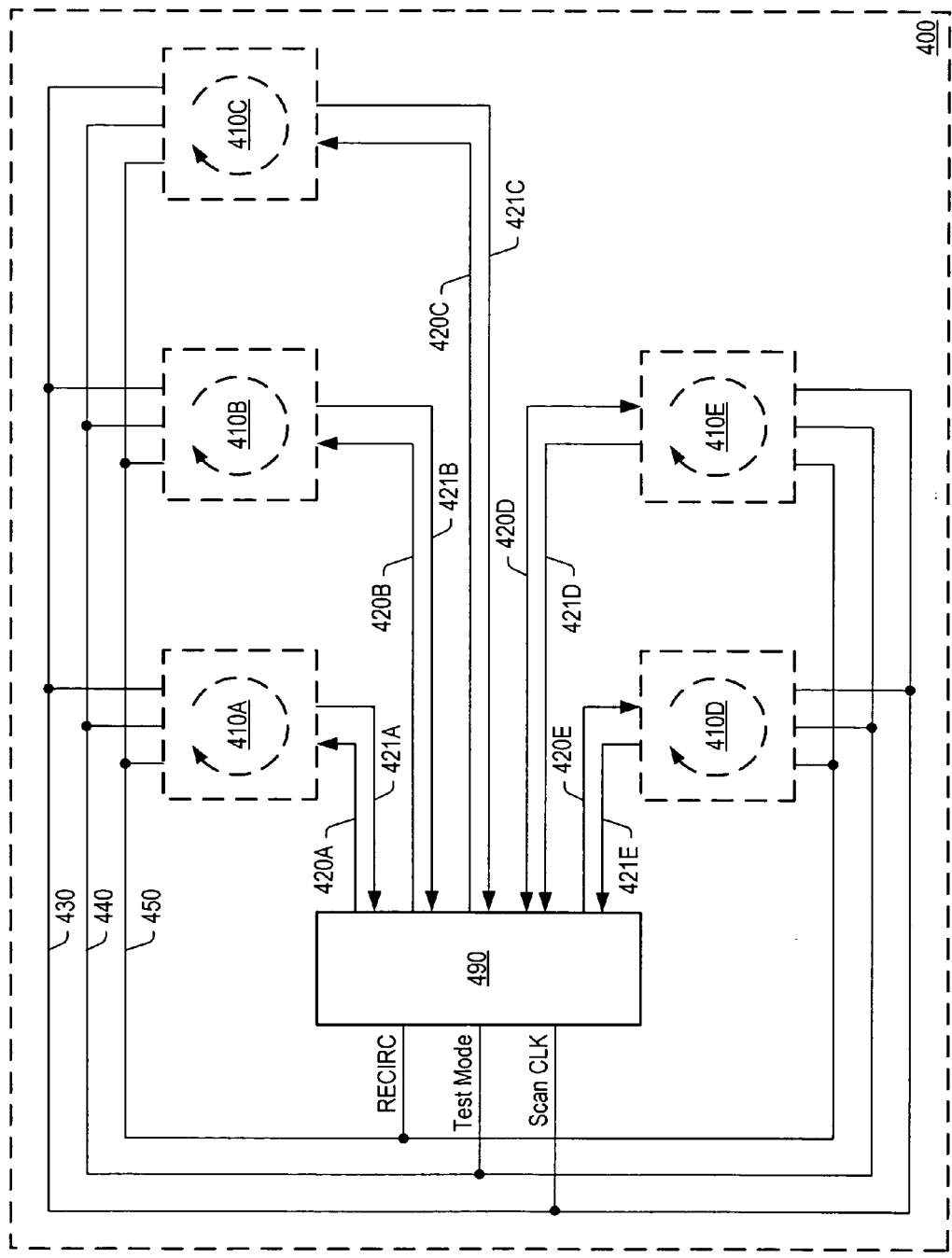
FIG. 4 is a block diagram of an exemplary integrated circuit configured for scan testing.

Turning now to FIG. 4, one embodiment of a design 400 is shown. In the embodiment shown, design 400 is partitioned into logic blocks 410A–410E which are configured for scan testing. Generally speaking, each of blocks may include multiple scan cells configured as a scan chain and through which test data is shifted. A control unit 490 is configured to convey a common clock signal 430 and a mode signal 440 to each of blocks 410. Each of blocks 410 are further coupled to control unit 490 via a test data in bus 420 and a test data out bus 421. In addition, control unit 490 is also configured to convey a recirculate signal 450 to each of blocks 410. Recirculate signal 450 may be separate signals to each of blocks 410, or could be a shared signal/bus coupled to all blocks 410. Generally speaking, recirculate signal 450 is configured to cause a block receiving the signal to recirculate its scan data internally while being clocked by the scan clock 430. In one embodiment, recirculate signal 450 may indicate that all blocks 410, except a particular block 410, are to recirculate their scan data. For example, recirculate signal 450 may indicate that block 410A is to scan its data out via bus 421A. While block 410A is scanning out its data, blocks 410B–410E are configured to recirculate their respective internal states. In this manner, the scan data for a particular block 410 may be scanned out via a bus 421 without losing the internal state of other blocks 410, even though a common scan clock is used for each of the blocks 410A–410E. Subsequently, recirculate signal 450 may indicate block 410B is to scan out its data while the other blocks recirculate, and so on.

In one embodiment, control unit 490 may be similar to that of TAP logic in a Joint Test Access Group (JTAG), or IEEE 1149.1 standard, based design. For example, the circuitry may include a register which may be loaded with an address corresponding to a particular block in the design 400. Based upon this address, a recirculate signal 450 may be asserted, or negated, for the corresponding block. In this manner a single block may be directed to recirculate, or all but the addressed block may be directed to recirculate data. Alternative embodiments are possible as well. For example, the test circuitry may be configured to direct various combinations of blocks to recirculate data. Other embodiments may employ an addition pin, or pins, in the design to facilitate the addressing of one or more blocks for recirculation. Numerous embodiments are possible and are contemplated.

Figure 5:
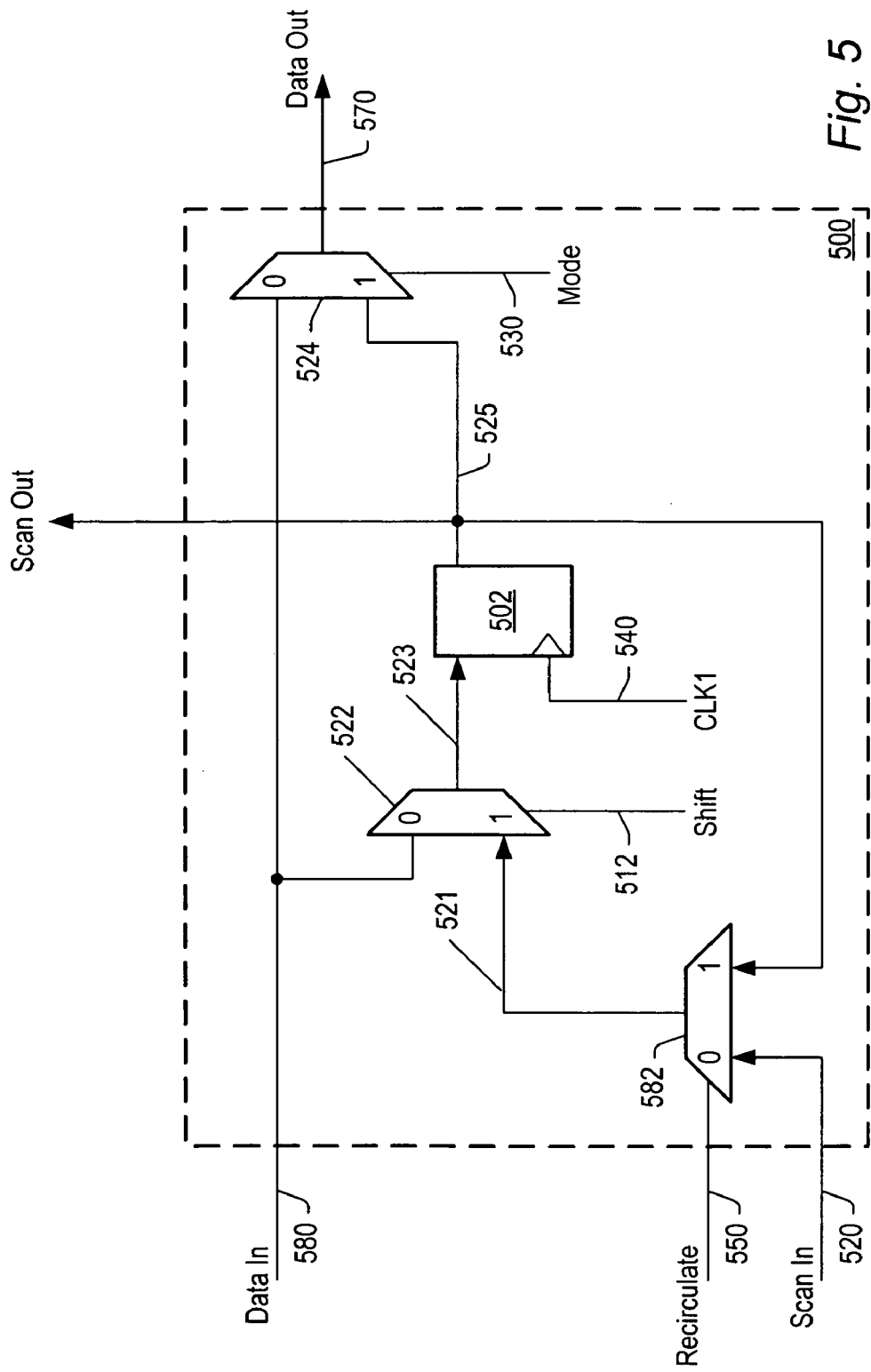
FIG. 5 is a block diagram of a scan cell.

FIG. 5 shows one embodiment of a single scan cell 500. It is to be understood that numerous other types and implementations of scan cells are possible and are contemplated. The cell as illustrated in FIG. 5 is provided for discussion purposes only. In the example of FIG. 5, cell 500 is coupled to receive data from multiplexor 582. Scan cell 500 receives signals Data In 580, signal 521, Shift 512, CLK1 540, and Mode 530. Also illustrated in FIG. 5 are multiplexors 582, 522, 524, and latch 502. Data In 580 may represent either a primary input of a device or an input signal from internal logic. Similarly, Data Out 570 may represent either a primary output of a device or a signal which is output to additional logic within a device. Multiplexor 582 is configured to pass either scan in signal 520 or scan data 525 as signal 521 in response to recirculate signal 550. Multiplexor could also be coupled to receive scan data from a scan cell later in the same scan chain as cell 500.

In a Normal Mode of operation, Mode signal 530 is configured to select the Data In signal 580 for output from multiplexor 524. Consequently, while operating in Normal Mode, Data In 580 is passed directly to Data Out 570. Alternatively, Mode signal 530 may select signal 525 for output via multiplexor 524. In a Scan Mode of operation, Scan In signal 520 is gated through multiplexor 582 and multiplexor 522. The corresponding signal 523 is then captured by latch 502 by a pulse of clock signal CLK1 540. CLK1 540 is a derivative of the system scan clock and generally operates whenever the scan clock operates. Once captured in Scan Mode, the value of the scanned in signal 520 is represented by the current state of latch 502 as signal 525. During Scan Mode, Recirculate signal 550 has a value of "0" in order to gate the Scan In signal 520 through multiplexor 582.

In a Capture Mode, scan cell 500 is configured to capture the value of the Data In signal 580 into latch 502. Therefore, in Capture Mode, Shift signal 512 has a value of "0" and clock signal CLK1 540 is pulsed to capture the corresponding value passed by multiplexor 522 as signal 523. Still further, cell 500 includes an Update Mode in which the currently captured value represented by the state (signal 525) of latch 502 is gated out of the cell 500 as Data Out 570. To gate out signal 525, CLK2 514 is pulsed and Mode signal 530 is set to value "1".

Finally, in addition to the above modes, cell 500 is configured to operate in a Recirculating Mode. During Recirculating Mode, CLK1 540 is active. As illustrated, the current state of latch 502 is represented by signal 525. Recirculate signal 550 has value "1" to pass the value of signal 525 from multiplexor 582 as signal 521. Shift signal 512 has value "1" to pass the value through multiplexor 522 where it is captured by latch 502. Table 1 below illustrates one embodiment of the various modes of operation and signal values. It is noted that the embodiment illustrated in FIG. 5 is intended to be exemplary only. Those skilled in the art will recognize alternative embodiments are possible as well. Such alternative embodiments are also contemplated.

| MODE | SIGNALS | | | | |
|---|---|---|---|---|---|
| | Recirculate 550 | Shift 512 | CLK1 540 | CLK2 514 | Mode 530 |
| Normal | — | — | — | — | 0 |
| Capture | — | 0 | pulse | — | — |
| Scan | 0 | 1 | pulse | — | — |
| Recirculate | 1 | 1 | pulse | — | — |

Figure 6:
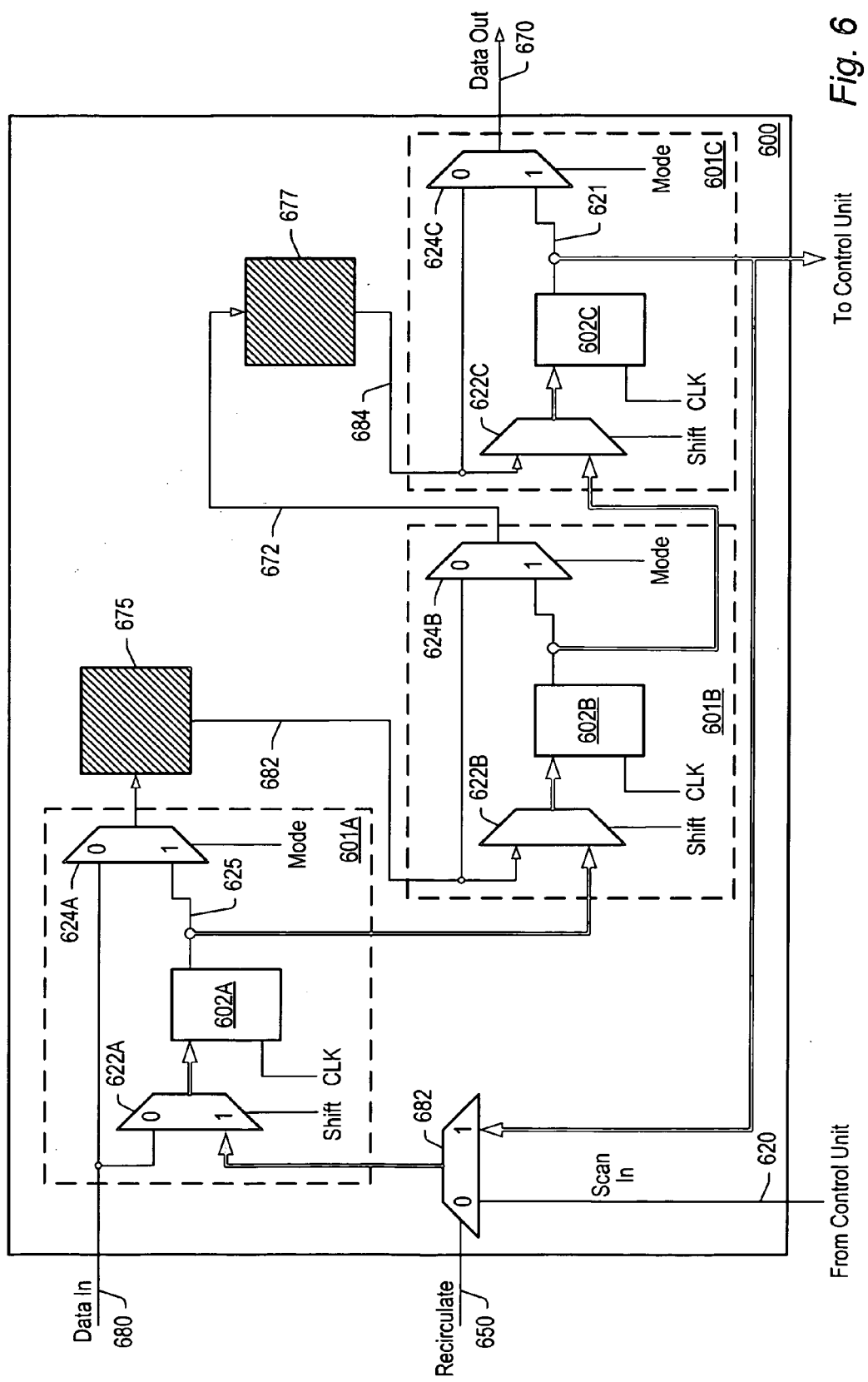
FIG. 6 is a block diagram of a scan chain configured for recirculation.

Turning now to FIG. 6, a block 600 configured to recirculate its scan chain is illustrated. Block 600 includes scan cells 601A–601C which are coupled to logic 675 and 677. In one embodiment, block 600 represents one of many partitions, or blocks, of a design. In the embodiment shown, block 600 receives signals Data In 680, Recirculate 650 and Scan In 620. Block 600 conveys Data Out signal 670. Block 600 also includes Shift, CLK1, and Mode signals which are shown coupled to each of cells 601. Each of the signals Shift, CLK1, and Mode may correspond to those described in FIG. 5. In addition to the above, block 600 includes a multiplexor 682 coupled to receive a Scan In signal 620 and a signal 621 representing the state of latch 602C.

Generally speaking, each of cells 601 may operate in the manner described in FIG. 5. As already noted, numerous possible types and implementations of scan cells may be utilized. While FIG. 5 illustrates a single scan cell, the embodiment of FIG. 6 illustrates a larger block 600, including multiple scan cells 601, which is configured to recirculate its entire scan chain. For example, if it is desired that block 600 recirculate its scan data while the scan clock is active, Recirculate signal 650 is set to the value "1", and the Shift signal is set to value "1". In this manner, with each pulse of CLK1, the state of latch 602A (represented by signal 625) is captured by latch 602B, the state of latch 602B shifts to latch 602C, and the state of latch 602C (as represented by signal 621) is gated through multiplexors 682 and 622A where it is captured by latch 602A.

Ordinarily the scan data within block 600, as represented by the state of latches 601A–601C, may be scanned out of block 600 as signal 621 in a particular order. For example, the state of latch 602C would be scanned out, followed by the states of latches 602B and 602A, respectively. However, with the ability to recirculate data within block 600 the possibility of scanning the data out in a different order exists. For example, if the scan data within block 600 were recirculated one position and then scanned out via signal 621, the states of the latches 602 would appear in the order 602B, 602A, and 602C.

With knowledge of the number of scan cells in a particular block, and the number of scan clock pulses applied to a block, the location of a particular scan data bit within a recirculated scan chain can be known. In one embodiment, control circuit 490 includes an indication (e.g., programmable or hardwired) of the number of scan cells included in each of blocks 410. Control circuit 490 may be further configured to track the number of scan clock pulses applied to each block 410. Alternatively, tracking of scan chain shifts and/or clock pulses may be accomplished with software. In the illustrative embodiment of FIG. 6, block 600 includes 3 scan cells 601. Consequently, three scan clock pulses will recirculate the scan chain within block 600 to its original position. Therefore, if it is desired that data within a block be scanned out in its original order, and the data within the block has undergone recirculation, control circuit 490 may further recirculate the data to return it to its original position prior to scanning out the data. In general, if the scan chain of a particular block is of length N, and the scan chain has been recirculated M cycles, the scan chain may be returned to its original position by recirculating the scan chain (M % N) cycles, where "%" is the modulus operator.

While it is possible to return a scan chain to its original position prior to scanning it out, this is not necessary. By keeping track of the lengths of each scan chain in a design and the number of cycles each has been recirculated, the original order of the scan chains may be recreated after the scan chains have been scanned out.

It is noted that the above figures are intended to be exemplary only. Various implementations may utilize different embodiments to accomplish the above described methods and mechanisms. Further, in general any number of scan paths may be combined to form a common scan path. A particular design may include multiple independent scan chains which are not directly coupled together.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system configured for scan chain testing, said system comprising:
   a scan clock signal;
   a first block coupled to the scan clock signal, wherein the first block includes a first plurality of scan cells, each of the first plurality of scan cells being configured to maintain a scan cell state; and a second block coupled to the scan clock signal, wherein the second block includes a second plurality of scan cells, each of the second plurality of scan cells being configured to maintain a scan cell state;

wherein each of the first block and the second block are configured to operate in a first mode, wherein in the first mode the first block is configured to convey the first plurality of scan cell states out of the first block responsive to detecting the scan clock signal; and wherein the first block is configured to operate in a second mode, wherein in the second mode the first block is configured to recirculate its scan cell states responsive to detecting the scan clock signal;

wherein whenever the first block conveys scan cell states between the first plurality of scan cells, the second block conveys scan cell states between the second plurality of scan cells;

a control circuit configured to return said first plurality of scan cells to an original state by:
  determining a number N of said first plurality of scan cells;
  determining a number M of cycles the first plurality of scan cells has recirculated subsequent to being in said original state;
  determining a number P of cycles required to return said scan cells to said original state, wherein P is calculated to be M % N cycles, where % is the modulus operator; and
  recirculating the first plurality of scan cells an additional P cycles.

2. The system of claim 1, wherein in the first mode the second block is configured to convey the second plurality of scan cell states out of the second block responsive to detecting the scan clock signal, and wherein the first block is configured to operate in the second mode concurrently with the second block operating in the first mode.

3. The system of claim 2, wherein the first block is configured to operate in said second mode responsive to detecting a recirculate signal.

4. The system of claim 3, wherein the first block is configured to recirculate the first plurality of scan cell states by shifting the first plurality of scan cells states in a circular manner.

5. The system of claim 3, further comprising a control circuit configured to generate said recirculate signal.

6. The system of claim 5, wherein said control circuit includes an address register configured to store an address corresponding to either said first or second block, and wherein an address stored in said register is indicative of a corresponding block which is to scan out its scan cell states.

7. The system of claim 5, wherein the control circuit is:
coupled to the first block by a first scan chain; and
coupled to the second block by a second scan chain;
wherein the first scan chain and the second scan chain are separate scan chains.

8. A method for scan chain testing comprising:
receiving a scan clock signal in a first block of a device, the first block including a first plurality of scan cells, each of the first plurality of scan cells being configured to maintain a scan cell state;
receiving the scan clock in a second block of the device, the second block including a second plurality of scan cells, each of said second plurality of scan cells being configured to maintain a scan cell state;
conveying the first plurality of scan cell states out of the first block responsive to detecting the scan clock signal; and
recirculating the second plurality of scan cell states responsive to detecting the scan clock signal;
wherein whenever the first block conveys scan cell states between the first plurality of scan cells, the second block conveys scan cell states between the second plurality of scan cells; and
returning said first plurality of scan cells to an original state by:
  determining a number N of said first plurality of scan cells;
  determining a number M of cycles the first plurality of scan cells has recirculated subsequent to being in said original state; and
  determining a number P of cycles required to return said scan cells to said original state, wherein P is calculated to be M % N cycles, where % is the modulus operator; and
  recirculating the first plurality of scan cells an additional P cycles.

9. The method of claim 8, wherein said conveying is in further response to the first block detecting a first mode of operation, and wherein said recirculating is in further response to the second block detecting a second mode of operation.

10. The method of claim 9, wherein said conveying is concurrent with said recirculating.

11. The method of claim 9, wherein the second block is configured to operate in said second mode responsive to detecting a recirculate signal.

12. The method of claim 11, wherein the second block is configured to recirculate the second plurality of scan cell states by shifting the second plurality of scan cells states in a circular manner.

* * * * *